United States Patent [19]

Kuo

[11] 4,368,420

[45] Jan. 11, 1983

[54] SUPPLY VOLTAGE SENSE AMPLIFIER

[75] Inventor: James R. Kuo, Cupertino, Calif.

[73] Assignee: Fairchild Camera and Instrument Corp., Mountain View, Calif.

[21] Appl. No.: 254,338

[22] Filed: Apr. 14, 1981

[51] Int. Cl.³ ............................ G05F 1/58; G05F 3/20
[52] U.S. Cl. .................................... 323/303; 323/267; 323/281; 323/313; 323/901; 323/907
[58] Field of Search ............................ 307/296 R, 297; 323/226, 311–316, 299, 303, 901, 907, 267, 268–272, 281; 330/296

[56] References Cited

U.S. PATENT DOCUMENTS

| | | | |
|---|---|---|---|
| 3,908,162 | 9/1975 | Marley et al. | 323/313 |
| 4,079,308 | 3/1978 | Brown | 323/314 |
| 4,095,164 | 6/1978 | Ahmed | 323/226 |
| 4,100,437 | 7/1978 | Hoff | 323/314 X |
| 4,274,061 | 6/1981 | Kraemer | 323/315 X |
| 4,277,739 | 7/1981 | Priel | 323/314 X |

OTHER PUBLICATIONS

Chin et al., "On–Chip Reference Voltage Generator", IBM Technical Disclosure Bulletin, vol. 20, No. 7, Dec. 1977, pp. 2709, 2710.
Gersbach, "Slope Sensitive Voltage Source", IBM Technical Disclosure Bulletin, vol. 19, No. 2, Jul. 1976, p. 415.

*Primary Examiner*—A. D. Pellinen
*Attorney, Agent, or Firm*—Kenneth Olsen; T. S. Park; Warren M. Becker

[57] ABSTRACT

A temperature-compensated reference voltage circuit includes a transistor having a positive temperature coefficient of current. A circuit for establishing a predetermined current in the positive-temperature-coefficient-of-current transistor is connected to that transistor. A predetermined resistance serially connects the positive-temperature-coefficient-of-current transistor with a transistor having negative temperature coefficient of base-to-emitter voltage. The temperature-compensated reference voltage is established between the transistors. The temperature-compensated reference voltage circuit is particularly useful in a supply voltage sense amplifier circuit for thermal printhead drive transistors or other load elements. The sense amplifier circuit includes a circuit for comparing the reference voltage and a supply voltage. An output is adapted to be connected to a load for receiving the supply voltage. A circuit is connected to receive an input from the comparing circuit, and to said output, for enabling the output when the supply voltage is equal or greater than the reference voltage.

12 Claims, 4 Drawing Figures

SUPPLY VOLTAGE SENSE AMPLIFIER

CROSS-REFERENCE TO RELATED APPLICATIONS

This application, a concurrently filed application in the names of James R. Kuo and Maggie Leung, entitled "Integrated Circuit Power Transistor Array", and a concurrently filed application by James R. Kuo, entitled, "Integrated Circuit Potential Reducing Technique", are directed to related inventions.

FIELD OF THE INVENTION

This invention relates to an improved temperature compensated reference voltage circuit. More particularly, this invention relates to a circuit for controlling supply voltage to a load element, which incorporates the improved temperature-compensated reference voltage circuit. Most especially, this invention relates to a sense amplifier circuit which will provide outputs to at least two different load circuit elements, depending on the level of a supply voltage.

DESCRIPTION OF THE PRIOR ART

There are a variety of circuits known in the art for providing predetermined reference voltages. For example, the well-known diode drop reference voltage circuit employs, for example, two serially connected diodes to establish a predetermined reference voltage, but that reference voltage is not temperature-compensated. Particularly in the case of integrated circuits which are designed to provide power inputs to a load, the operating temperatures of the circuit vary as the circuit is used. In such circuits, it is especially important that critical reference voltages be temperature-compensated.

Recognizing the need for temperature-compensated reference voltage circuits, the Widlar band-gap reference voltage circuit provides a temperature-compensated voltage reference at the silicon band-gap voltage of 1.31 volts. The Widlar band-gap reference voltage circuit is described in, for example, Widlar, "New Developments in IC Voltage Regulators", *IEEE Journal of Solid State Circuits,* February 1971, Vol. SC-6, No. 1, pp. 2–7. However, the Widlar band-gap reference voltage circuit is frequency sensitive. As a result, it is necessary to provide a fairly large metal-oxide-semiconductor (MOS) capacitor in the Widlar band-gap reference circuit in order to compensate for different frequencies that may be encountered in the use of the circuit.

A particularly demanding application for an integrated circuit supplying power signals to load elements is for driving thermal printhead elements. Such thermal printhead elements must each operate rapidly and in an identical manner to provide printing of uniform characters at an acceptable speed. Thus, control circuits for the operation of power transistors in such integrated circuits must supply their control signals in a uniform manner, independent of temperature and signal frequency variations in use of the circuits. While the design of control circuits for such power transistor arrays is a highly sophisticated art, a need still remains for further improvement in such control circuits.

SUMMARY OF THE INVENTION

Accordingly, it is an object of this invention to provide a temperature-compensated reference voltage circuit which is frequency independent, without the use of frequency compensation.

It is another object of this invention to provide a temperature-compensated reference voltage circuit which does not require the use of capacitive elements for frequency compensation.

It is still another object of the invention to provide a circuit for controlling supply voltage to a load element that incorporates such a temperature-compensated reference voltage circuit.

It is still another object of the invention to provide a sense amplifier circuit which provides outputs to at least two different circuit elements, depending on level of a supply voltage, and which incorporates such a temperature-compensated reference voltage circuit.

The attainment of these and related objects may be achieved through use of the novel temperature-compensated reference voltage circuit and sense amplifier circuit of this invention. The temperature-compensated reference voltage circuit of this invention includes a transistor having a positive temperature coefficient of current, desirably a PNP lateral transistor. There is means for establishing a predetermined current in the positive-temperature-coefficient-of-current transistor, which current establishing means is connected to that transistor. The circuit includes a transistor having a negative temperature coefficient of base-to-emitter voltage desirably a NPN vertical transistor. There is a predetermined resistance serially connecting the two transistors. The temperature-compensated reference voltage is therefore established between the two transistors.

A supply voltage sense amplifier circuit in accordance with this invention includes the temperature-compensated reference voltage circuit as described above. A means is connected to receive the reference voltage for comparing the reference voltage and a supply voltage. An output is adapted to be connected to a load for receiving the supply voltage. A means is connected to receive an input from the comparing means and to the output, for enabling the output when the supply voltage has a predetermined relationship relative to the reference voltage. Typically, the relationship is when the supply voltage equals or exceeds the reference voltage at the point of measurement.

In a preferred embodiment of the sense amplifier circuit, there are alternative outputs, each controlled by at least one output transistor. The supply voltage is furnished at one output when the supply voltage is less than the reference voltage, and the supply voltage is supplied to another output when the supply voltage is equal to or greater than the reference voltage.

A supply voltage sense amplifier circuit incorporating the temperature-compensated reference voltage circuit of this invention provides control signals to a load element connected to the output of the circuit, such as a thermal printhead element. The supply voltage remains at a constant level, independent of frequency and temperature variations of an integrated circuit, including the sense amplifier. While these characteristics make the sense amplifier circuit of special value for controlling drive signals for thermal printhead elements, the circuit can be used for a wide variety of other applications.

The attainment of the foregoing and related objects, advantages and features of the invention should be more readily apparent to those skilled in the art after review of the following more detailed description of the invention, taken together with the drawings, in which:

DESCRIPTION OF THE PREFERRED EMBODIMENTS

Figure 1:
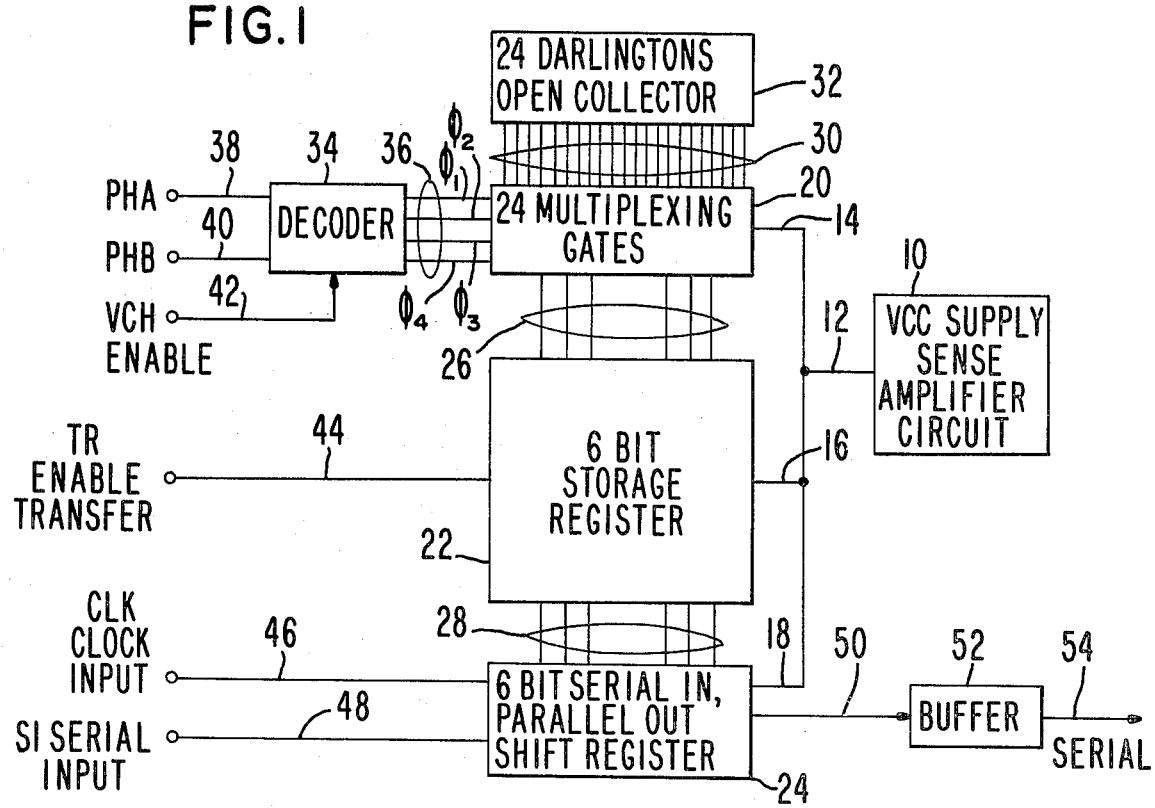
FIG. 1 is a block diagram of an integrated circuit incorporating the invention.

Turning now to the drawings, more particularly to FIG. 1, there is shown a block diagram of a thermal printhead driver integrated circuit incorporating the invention. A +VCC supply sense amplifier circuit 10 in accordance with the invention has outputs connected by lines 12, 14, 16 and 18 to multiplexing gates 20, 6-bit storage register 22 and 6-bit serial in, parallel out shift register 24. Lines 26 connect the 6-bit storage register 22 to multiplexing gates 20. Lines 28 connect the 6-bit storage register 22 to the 6-bit serial in, parallel out shift register 24. Lines 30 connect the multiplexing gates 20 to open collector Darlington pair drive transistors 32 for thermal printhead elements (not shown) connected as loads to the Darlington pair transistors 32. A decoder 34 is connected by lines 36 to the multiplexing gates 20. Inputs to the decoder 34 are supplied on lines 38, 40 and 42. A transfer enable input is supplied to 6-bit storage register 22 on line 44. Clock and data inputs are respectively supplied on lines 46 and 48 to the 6-bit serial in parallel out shift register 24. In addition to the parallel outputs on lines 28 from the serial in parallel out shift register 24, a serial output is also supplied on line 50 to buffer 52 for transmission off the integrated circuit on line 54.

In operation, the Darlington pair output transistors 32 provide drive signals to thermal printhead elements when selected by operation of the decoder 34 and the multiplexing gates 20, and when the +VCC supply voltage is above a predetermined level, as determined by the sense amplifier circuit 10. Further details of an integrated circuit incorporating the block diagram of FIG. 1 are available in the above-referenced, concurrently filed Kuo et al application, and the above-referenced Kuo application, the disclosures of which are incorporated by reference herein.

Figure 2:
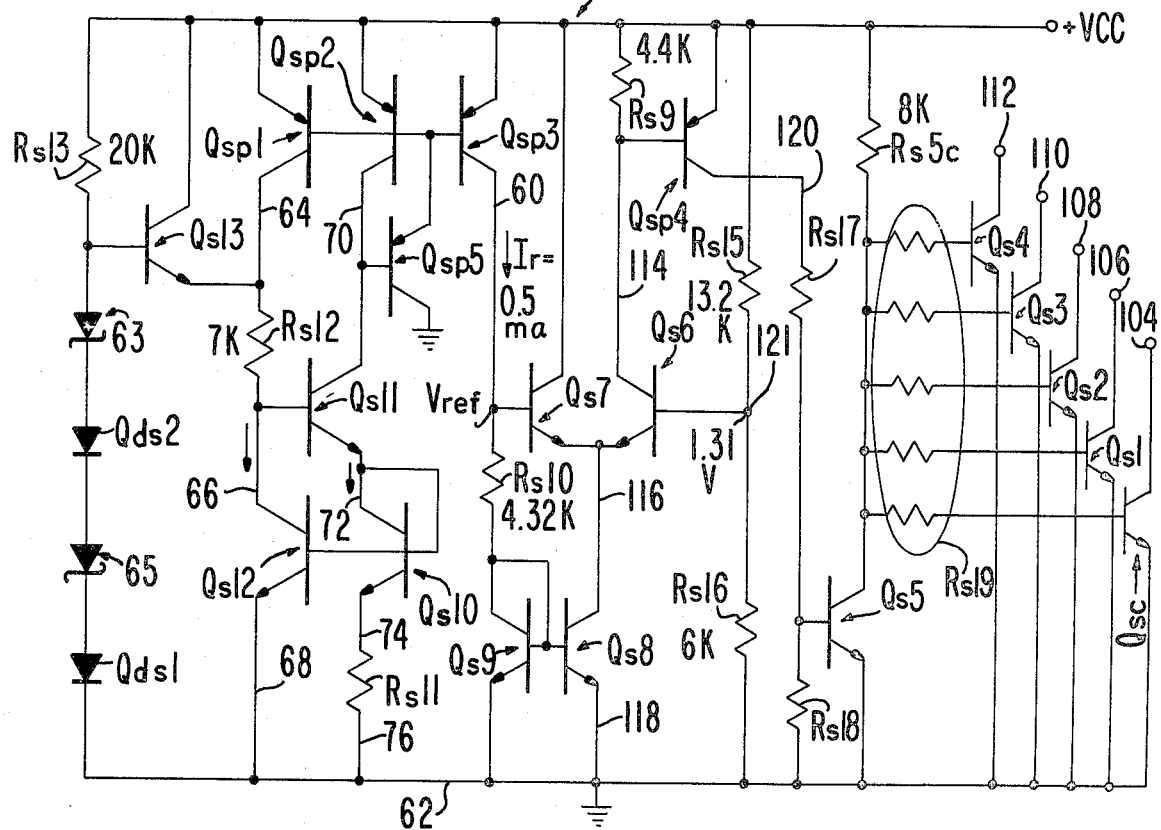
FIG. 2 is a circuit schematic of an embodiment of the invention, as implemented in the integrated circuit of FIG. 1.

Turning now to FIG. 2, there is shown a circuit schematic of the sense amplifier circuit 10 of FIG. 1. The sense amplifier circuit 10 incorporates a temperature-compensated reference voltage circuit, which establishes a reference voltage Vref at the base electrode of transistor Qs7. The voltage to be compared against the reference voltage Vref is supplied at the base electrode of transistor Qs6. If that base electrode voltage is less than Vref, transistor Qs7 is on and Qs6 is off. It will be noted that the FIG. 2 embodiment is a silicon band-gap voltage reference circuit, i.e., Vref is equal to 1.31 volts. However, unlike the Widlar band-gap voltage reference circuit, no frequency compensation MOS capacitor is required. As will be seen from the following discussion, Vref could be selected to be essentially any value somewhat less than the +VCC supply voltage, but there are certain advantages from a semi-conductor device physics standpoint in choosing the silicon band-gap voltage of 1.31 volts.

Vref is established by current Ir through the path including transistor Qsp3, line 60, resistor Rs10, and transistor Qs9 to ground via line 62. Transistor Qsp3 has a positive temperature coefficient of current. Transistor Qs9 has a negative temperature coefficient base-to-emitter voltage Vbe, obtained by making Qs9 a vertical NPN transistor. Transistors Qsp1 and Qsp2 are lateral PNP transistors each having an identical configuration to transistor Qsp3.

Transistors Qs10 and Qs12 each have a positive temperature coefficient of current. The current through transistor Qs10 is mirrored through Qsp3. Feeding the mirrored current through resistor Rs10 provides a positive temperature coefficient voltage drop. This positive voltage drop will compensate for the negative temperature coefficient of the Vbe of Qs9.

Transistor Qs13 is used to start up the amplifier 10. When +VCC reaches a threshold level of three times the Vbe of transistor Qs13, for the particular circuit arrangement shown, that transistor conducts. Transistor Qs13 then provides the start-up current for transistor Qs11 so that the current flow path including transistor Qsp1, line 64, resistor Rs12, line 66, transistor Qs12, line 68 and line 62 to ground conducts its final current of 0.15 mA. This results in a sufficient voltage drop across resistor Rs12 to cut off transistor Qs13, because the base of transistor Qs13 is clamped at 2.2 volts by Schottky diodes 63 and 65 and diodes Qds1 and Qds2.

The emitter width of transistor Qs10 is twice the emitter width of transistor Qs12. Since transistors Qsp1 and Qsp2 have identical geometries, their collector currents are equal, and the emitter currents of transistors Qs10 and Qs12 are likewise equal. Accordingly, the current density of transistor Qs12 is twice that of transistor Qs10. Current through the path consisting of transistor Qsp2, line 70, transistor Qs11, line 72, transistor Qs10, line 74, resistor Rs11, and line 76 is equal to the current Ir in the current flow path including transistors Qsp3 and Qs9. Both current flows are equal to kTln2/qRs11, wherein k is Boltzmann's constant, T is absolute temperature, and q is the charge of an electron. Therefore, $$V_{ref} = I_r R_{s10} + V_{be} \text{ of } Q_{s9} = \frac{R_{s10}}{R_{s11}} \frac{kT}{q} \ln 2 + V_{be} \text{ of } Q_{s9}.$$

Current flow through resistor Rs11 is thus duplicated through resistor Rs10. As a result, Vref can be set to the band-gap voltage of 1.31 volts with proper selection of Rs10/Rs11.

Figure 3:
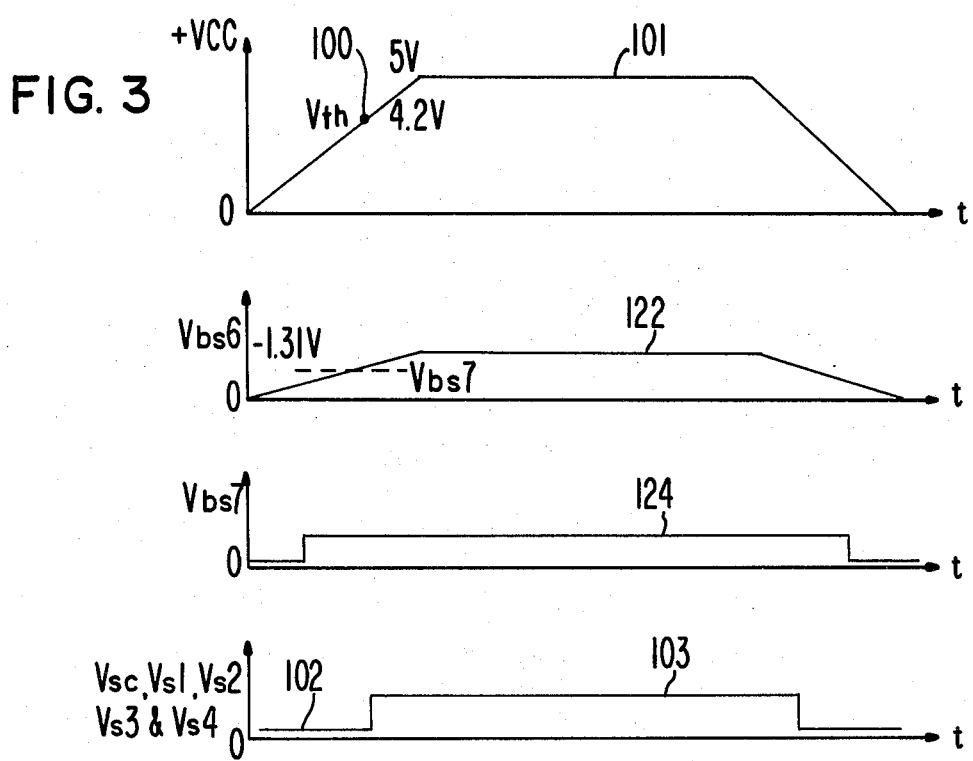
FIG. 3 is a waveform diagram useful for understanding operation of the circuit in FIG. 2.

FIG. 3 is an operation and timing waveform diagram of the sense amplifier circuit 10 in FIG. 2, useful for understanding operation of the sense amplifier circuit 10. Before +VCC reaches 4.2 volts as shown at 100 in the +VCC curve 101 of FIG. 3, transistors Qsc and Qs1, Qs2, Qs3 and Qs4 are in saturation, as indicated at 102 in the waveform 103 of the voltages Vsc, Vs1, Vs2, Vs3, and Vs4, which represent, respectively, the voltages at terminals 104, 106, 108, 110 and 112 in FIG. 2. When +VCC reaches 4.2 volts, a voltage level of 1.31 volts is established at 121 between resistors Rs15 and Rs16. Transistor Qs6 turns on, causing current flow in the path including resistor Rs9, line 114, transistor Qs6, line 116, transistor Qs8, and line 118 to ground. As a result, transistor Qsp4 is turned on to produce current flow in line 120, thus turning on transistor Qs5. When transistor Qs5 saturates, transistors Qsc and Qs1, Qs2, Qs3 and Qs4, which disable the printer driver when they are on, are then cut off. Resistors Rs17, Rs18 and Rs19 establish proper voltage levels at the bases of transistors Qs5, Qsc, Qs1, Qs2, Qs3, and Qs4 for operation as set forth above.

Waveforms 122 and 124 show the voltages, respectively, at the bases of transistors Qs6 and Qs7 in operation of the circuit.

The supply voltage sense amplifier circuit of FIG. 2, in addition to being useful for driving an array 32 of Darlington pair power transistors (FIG. 1) used to drive a thermal printhead, can also be used in MOS or charge coupled device (CCD) memory systems to disable transistor-transistor logic (TTL) circuitry or to enable other drivers from a power supply, resulting in power savings.

Figure 4:
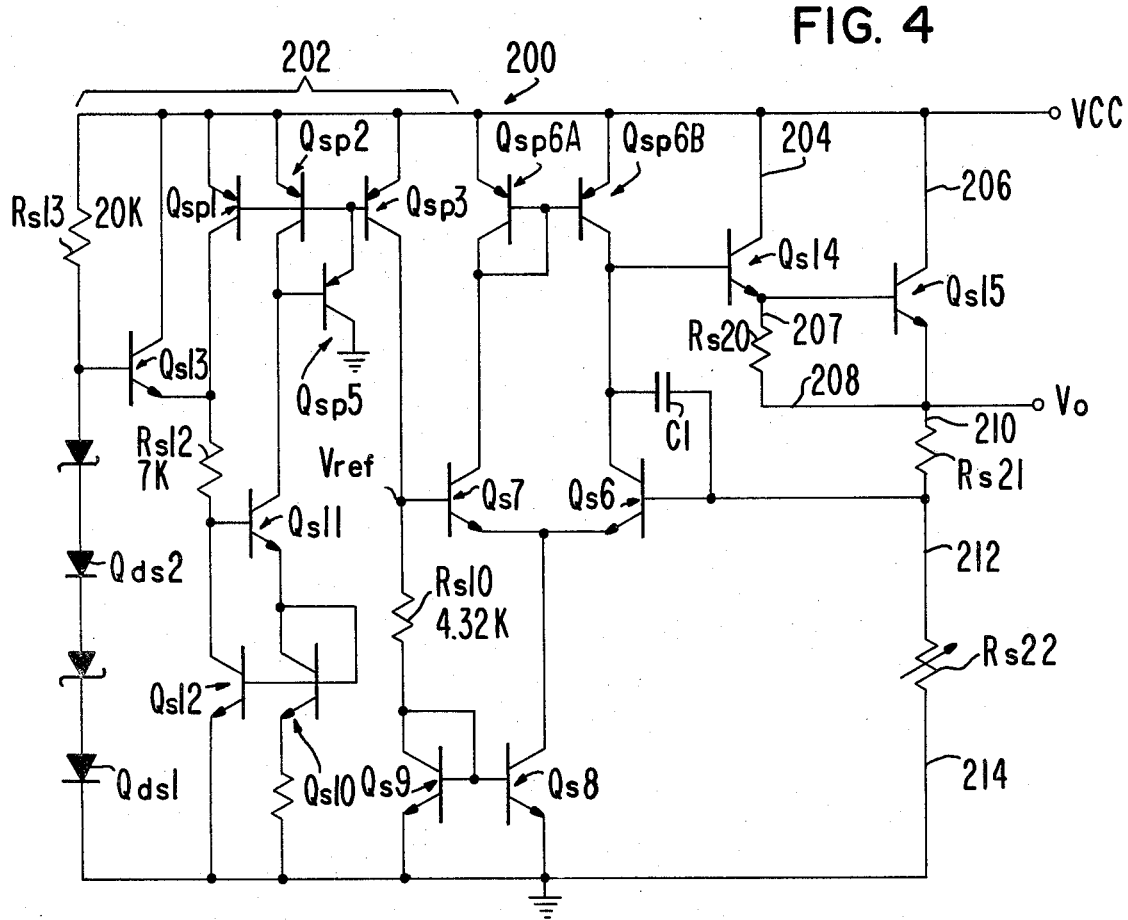
FIG. 4 is a circuit schematic diagram of another embodiment of the invention.

FIG. 4 shows an alternative embodiment of the invention, in which the temperature-compensated reference voltage circuit of this invention is used in a programmable reference voltage circuit 200. The elements in the left portion 202 of this circuit are identical to corresponding elements in the circuit of FIG. 2, and corresponding references for them are employed in FIG. 4. Also, they operate in the same manner as the corresponding elements in FIG. 2, and their operation will, therefore, not be explained at this point. Transistors Qsp6A and Qsp6B have, respectively, been added above transistors Qs7 and Qs6. Capacitor C1 connects the collector and base of transistor Qs6. Darlington pair transistors Qs14 and Qs15 are connected between the +VCC supply voltage and ground by lines 204, 206, 207, resistor Rs20, line 210, resistor Rs21, line 212, variable resistor Rs22 and line 214.

In operation, the circuit of FIG. 4 provides a reference voltage Vo, which may be set to a desired level by varying the resistance of variable resistor Rs22. If the voltage at line 212 is higher than Vref, i.e., 1.31 volts in the embodiment, Qs6 will conduct more current until the voltage at 212 equals Vref. Since changing the value of variale resistor Rs22 changes the operation point of the circuit at which the voltage at 212 equals Vref, such variation in turn varies output reference voltage Vo of the circuit 200. The reference voltage Vo is temperature compensated as a result of operation of the temperature-compensated voltage reference Vref and sense amplifier portion of the circuit 200, in the same manner as in the FIG. 2 embodiment.

It should now be apparent to those skilled in the art that a temperature-compensated reference voltage and supply voltage sense amplifier circuit capable of achieving the stated objects of the invention has been provided. The temperature-compensated reference voltage is frequency independent, without requiring the use of a frequency compensation capacitor. The supply voltage sense amplifier circuit incorporating the temperature-compensating reference voltage circuit of this invention provides voltage control signals to load elements, and will provide outputs to at least two different load elements, depending on the level of a supply voltage. Another version of the circuit supplies a programmable, temperature-compensated output reference voltage to a load element.

It should further be apparent to those skilled in the art that various changes in form and details of the invention as shown and described may be made. It is intended that such changes be included within the spirit and scope of the claims appended hereto.

What is claimed is:

1. A temperature-compensated supply voltage sense amplifier comprising: a first transistor circuit including a transistor means having a positive temperature coefficient of current for providing a positive temperature coefficient current in which the current increases with increasing temperature;
    a second transistor circuit including a transistor means having a negative temperature coefficient of base-to-emitter voltage;
    a third transistor circuit including transistors means forming a current mirror coupled between said first and said second transistor circuits for transferring said positive temperature coefficient current from said first transistor circuit into said second transistor circuit; and
    a resistance means coupled between said third transistor circuit and said second transistor circuit for establishing a constant reference voltage at a first node between said resistance means and said current mirror, the magnitude of which is independent of temperature.

2. A sense amplifier according to claim 1 wherein said first transistor means comprises: a first pair of transistors configured to have a predetermined difference in their base-to-emitter voltages when conducting, and each having a positive temperature coefficient of current, and a first resistive element having a predetermined resistance; said current mirror comprises a second pair of transistors connected to said first pair of transistors for supplying current to said first pair; and said resistance means comprises a second resistive element having a resistance relative to the resistance of said first resistive element such that current flow through said second resistive element establishes the temperature-compensated reference voltage.

3. The sense amplifier circuit of claim 2 in which said second pair of transistors are PNP lateral transistors.

4. The sense amplifier circuit of claim 1 or 2 in which said negative temperature-coefficient transistor is an NPN vertical transistor.

5. A supply voltage sense amplifier circuit according to claim 1 comprising:
    means for comparing the reference voltage and a supply voltage;
    an output circuit adapted to be connected to a load; and
    means connected to said comparing means and said output circuit for receiving an input from said comparing means and enabling said output circuit when the supply voltage has a predetermined relationship relative to the reference voltage.

6. The sense amplifier circuit of claim 5 in which said means for comparing comprises first and second transistors, each controlling alternative current flow paths, the first transistor being connected to receive the reference voltage as a control input, and the second transistor being connected to receive the supply voltage as a control input.

7. The sense amplifier circuit of claim 6 additionally comprising a first output transistor connected to receive the supply voltage and a control signal for turning on said first output transistor when the supply voltage at said second transistor is at least equal to said reference voltage at said first transistor.

8. The sense amplifier circuit of claim 7 additionally comprising at least a second output transistor connected to supply an output current when said first output transistor is turned off and to be turned off when said first output transistor is turned on.

9. The sense amplifier circuits of claim 7 additionally comprising a resistive element having a variable resistance connected between said first output transistor and a predetermined potential, the output voltage from said first output transistor being both variable and temperature-compensated.

10. The sense amplifier circuit of claim 9 in which said first output transistor comprises one transistor of a Darlington pair.

11. A sense amplifier according to claim 1 wherein said current mirror comprises a constant current source at a given temperature.

12. A sense amplifier according to claim 1 wherein said transistor means in said second transistor circuit comprises means for decreasing the magnitude of the voltage on a second node between said resistance means and said second transistor circuit with increasing temperature for providing said constant reference voltage on said first node.

* * * * *